(12) United States Patent
Ramaraju et al.

(10) Patent No.: US 9,117,507 B2
(45) Date of Patent: Aug. 25, 2015

(54) MULTISTAGE VOLTAGE REGULATOR CIRCUIT

(75) Inventors: Ravindraraj Ramaraju, Round Rock, TX (US); Kenneth R. Burch, Austin, TX (US); Charles E. Seaberg, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 1121 days.

(21) Appl. No.: 12/853,106

(22) Filed: Aug. 9, 2010

(65) Prior Publication Data

US 2012/0032655 A1 Feb. 9, 2012

(51) Int. Cl.
G05F 1/10 (2006.01)
G11C 5/14 (2006.01)
G05F 1/577 (2006.01)
G05F 1/00 (2006.01)

(52) U.S. Cl.
CPC ........ *G11C 5/147* (2013.01); *G05F 1/00* (2013.01); *G05F 1/577* (2013.01)

(58) Field of Classification Search
CPC .................................................. G11C 5/147
USPC ......... 323/267, 271, 273, 311, 317, 203, 224, 323/268, 272, 282; 365/154, 156, 185, 189, 365/191, 208, 202, 205, 203, 204, 189.11, 365/185.25, 207
See application file for complete search history.

(56) References Cited

U.S. PATENT DOCUMENTS

| | | | | |
|---|---|---|---|---|
| 4,816,778 A | * | 3/1989 | Weber | 331/57 |
| 5,946,241 A | * | 8/1999 | Zink et al. | 365/189.15 |
| 6,195,297 B1 | * | 2/2001 | Sano | 365/189.11 |
| 6,288,960 B1 | * | 9/2001 | Conte et al. | 365/205 |
| 6,320,795 B1 | | 11/2001 | Balamurugan et al. | |
| 6,496,056 B1 | * | 12/2002 | Shoji | 327/543 |
| 6,801,470 B2 | | 10/2004 | Clark et al. | |
| 6,928,128 B1 | * | 8/2005 | Sidiropoulos | 375/376 |
| 7,055,007 B2 | | 5/2006 | Flautner et al. | |
| 7,061,820 B2 | | 6/2006 | Deng | |
| 7,209,395 B2 | | 4/2007 | Hsu et al. | |
| 7,366,036 B2 | | 4/2008 | Cheng et al. | |
| 7,400,523 B2 | | 7/2008 | Houston | |
| 7,400,545 B2 | | 7/2008 | Ramaraju et al. | |
| 7,443,759 B1 | | 10/2008 | Rowlands et al. | |
| 7,453,756 B2 | | 11/2008 | Moyer et al. | |
| 7,533,226 B2 | | 5/2009 | Flautner et al. | |
| 7,706,200 B2 | | 4/2010 | Chi | |

(Continued)

OTHER PUBLICATIONS

U.S. Appl. No. 12/372,997, filed Feb. 18, 2009.

(Continued)

*Primary Examiner* — Matthew Nguyen
*Assistant Examiner* — Trinh Dang

(57) ABSTRACT

Circuit embodiments of a multistage voltage regulator circuit are presented, where a circuit includes a first stage that includes a first bias transistor having a current terminal coupled to a first regulated node. The circuit also includes a second stage that includes a second bias transistor having a current terminal coupled to a second regulated node. The circuit also includes a third stage including a third bias transistor having a current terminal coupled to a third node. The circuit also includes a control loop for regulating voltages at the first and second regulated nodes, where the second regulated node is connected to a control terminal of the first bias transistor; and where the first regulated node is connected to a control terminal of the third bias transistor.

21 Claims, 4 Drawing Sheets

(56) References Cited

U.S. PATENT DOCUMENTS

| | | | |
|---|---|---|---|
| 7,707,468 B2* | 4/2010 | Volkerink et al. | 714/718 |
| 7,724,064 B2* | 5/2010 | Tihanyi et al. | 327/374 |
| 2006/0158265 A1* | 7/2006 | Sumita | 331/16 |
| 2006/0170453 A1* | 8/2006 | Zerbe et al. | 326/37 |
| 2006/0267659 A1* | 11/2006 | Tsai et al. | 327/280 |
| 2007/0040595 A1* | 2/2007 | Kakuda et al. | 327/262 |
| 2007/0195610 A1* | 8/2007 | Park et al. | 365/185.29 |
| 2008/0055967 A1* | 3/2008 | Houston et al. | 365/154 |
| 2009/0285046 A1 | 11/2009 | Ehrenreich et al. | |
| 2009/0323401 A1 | 12/2009 | Huang et al. | |
| 2010/0008399 A1* | 1/2010 | Lachartre | 375/130 |
| 2011/0310678 A1* | 12/2011 | Lin | 365/189.07 |

OTHER PUBLICATIONS

U.S. Appl. No. 12/622,277, filed Nov. 19, 2009.
U.S. Appl. No. 12/843,547, filed Jul. 26, 2010.
Bhavnagarwala et al.; "A Pico-Joule Class, 1GHz, 32 KByte × 64b DSP SRAM with Self Reverse Bias"; 2003 Symposium on VLSI Circuits Digest of Technical Papers; 2003; pp. 251-252; IEEE.
Khellah et al.; "A 256-Kb Dual VCC SRAM Building Block in 65-nm CMOS Process With Actively Clamped Sleep Transistor"; IEEE Journal of Solid-State Circuits; Jan. 2007; pp. 233-242; vol. 42, No. 1; IEEE.
Tschanz et al.; "Dynamic Sleep Transistor and Body Bias for Active Leakage Power Control of Microprocessors"; IEEE Journal of Solid-State Circuits; Nov. 2003; pp. 1838-1845; vol. 38, No. 11; IEEE.
Zhang et al.; "Low-Power SRAMs in Nanoscale CMOS Technologies"; IEEE Transactions on Electron Devices; Jan. 2008; pp. 145-151; vol. 55, No. 1; IEEE.
Takashima et al.;Standy/Active Mode Logic for Sub-1-V Operating ULSI Memory; IEEE Journal of Solid-State Circuits; Apr. 1994; pp. 441-447; vol. 29, No. 4; IEEE.
Chang et al.; "The 65-nm 16-MB Shared On-Die L3 Cache for the Dual-Core Intel Xeon Processor 7100 Series"; IEEE Journal of Solid-State Circuits; Apr. 2007; pp. 846-852; Vo 42, No. 4; IEEE.
Chen et al.; "A 0.6 V Dual-Rail Compiler SRAM Design on 45 nm CMOS Technology With Adaptive SRAM Power for Lower VDD_min VLSIs"; IEEE Journal of Solid-State Circuits; Apr. 2009; pp. 1209-1215; vol. 44, No. 4; IEEE.
Wang et al.; "A 4.0 GHz 291 Mb Voltage-Scalable SRAM Design in a 32 nm High-k + Metal-Gate CMOS Technology With Integrated Power Management"; IEEE Journal of Solid-State Circuits; Jan. 2010; pp. 103-110; vol. 45, No. 1; IEEE.
U.S. Appl. No. 12/850,533, filed Aug. 4, 2010.

* cited by examiner

MULTISTAGE VOLTAGE REGULATOR CIRCUIT

BACKGROUND OF THE INVENTION

1. Field of the Invention

This invention relates in general to a voltage regulator and more specifically to a multistage voltage regulator.

2. Description of the Related Art

Voltage regulators are used to provide specific voltages for the operation of electronic circuitry. In one example, a voltage regulator can be used to provide a regulated supply voltage for a memory array for setting the voltage across the memory cells of a memory array. Also, the voltage provided to a circuit by a regulator may be changed during operation.

DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The Figures are not necessarily drawn to scale.

DETAILED DESCRIPTION

The following sets forth a detailed description of a mode for carrying out the invention. The description is intended to be illustrative of the invention and should not be taken to be limiting.

As described herein, a multistage regulator circuit provides regulated voltages to at least two different circuit modules. In one embodiment, the multistage regulator circuit includes multiple stages each with a circuit module that receives the regulated voltage from a regulated node and a bias transistor coupled to a power supply voltage and the regulated node. The control terminal of one bias transistor is coupled to a regulated node of another stage for controlling the voltage of the regulated node when enabled.

Figure 1:
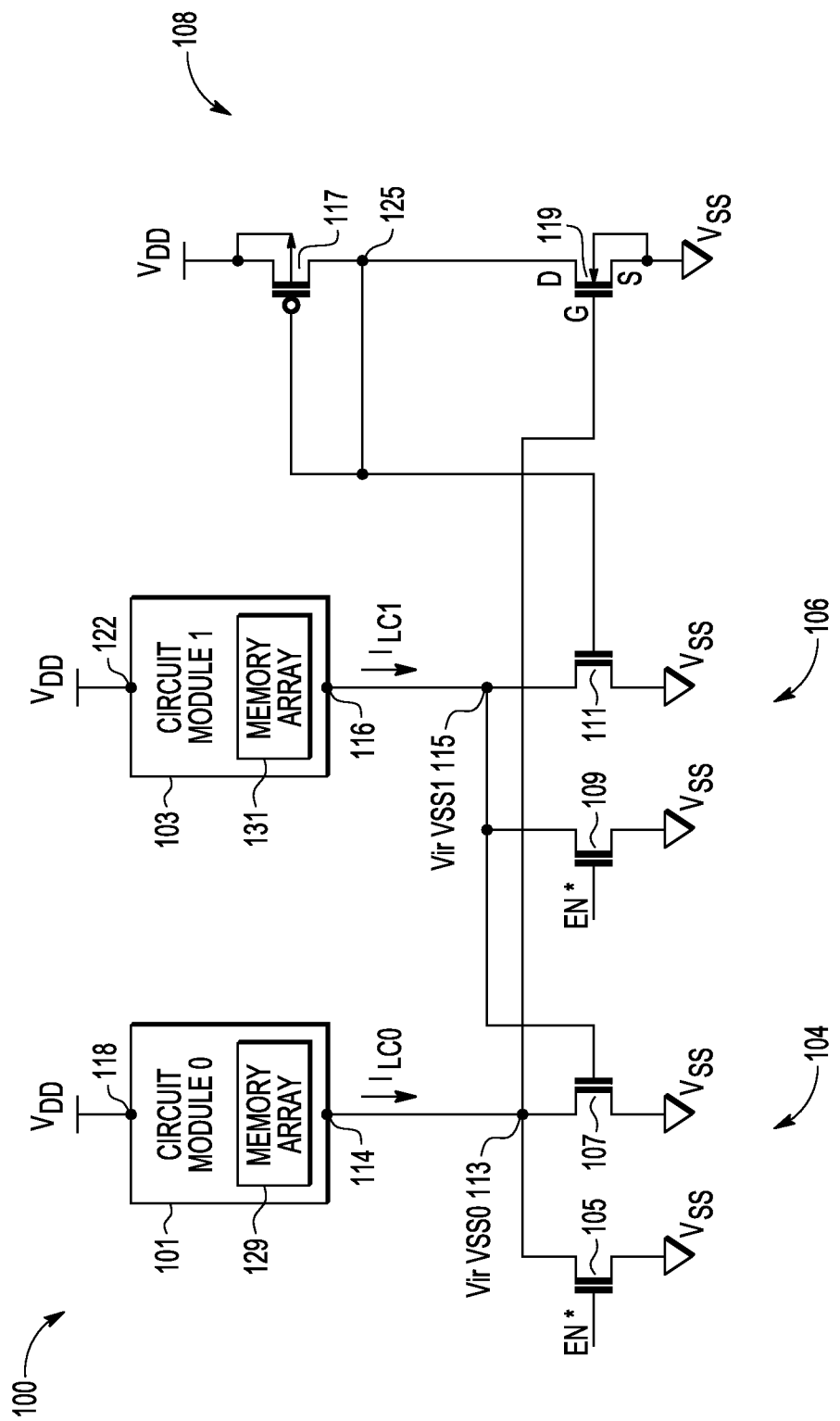
FIG. 1 is a circuit diagram of an electronic circuit with a multistage voltage regulator according to one embodiment of the present invention.

FIG. 1 is a block diagram of an electronic circuit 100. Circuit 100 includes a multistage regulator circuit with circuit module stages 104 and 106 each including a regulated node (113 and 115, respectively) for providing a regulated voltage (VirVSS0 and VirVSS1) to a respective circuit module (101 and 103) of its stage. The circuit modules may be any one of a number of circuit types that receive regulated voltages for operation. In one embodiment, each circuit module includes an array of memory cells (e.g. SRAM, flash, DRAM), which utilize the regulated voltage for supplying power to the memory cells during operation.

In the embodiment shown, each node (113 and 115) is connected to a low voltage supply terminal (114 and 116) of the circuit modules. The high voltage supply terminals (118 and 122) of the circuit modules 101 and 103 are supplied with a system power supply voltage VDD. Accordingly, the voltage drop of the power supply voltage to a circuit module is VDD minus the voltage of its respective regulated voltage node (113 or 115).

In the embodiment shown, the regulated voltage nodes 113 and 115 can be selectively enabled to provide either system ground voltage (VSS) or a voltage that is above system ground as set by bias transistor 119. For example the voltage above system ground can be 200 mV for an 1V system power supply voltage. However, other values above system ground can be provided in other embodiments. In the embodiment shown, each stage (104 and 106) includes an activation transistor (105 or 109) that when made conductive by an ENABLE signal (EN*) being in a non asserted high state causes the regulated node to be pulled to a system ground voltage VSS. When the EN* signal is in an asserted low state, the voltages of the regulated nodes (113 and 115) are controlled by the conductivity of the bias transistor (107 and 111) of the stage. In one embodiment, the ENABLE signal is used to selectively reduce the voltage drop across the circuit modules by raising the voltages of the low voltage supply terminals (114 and 116) from system ground (VSS) to a higher voltage.

In one embodiment where each circuit module includes a memory array, enabling the EN* signal to provide a higher voltage at regulated nodes 113 and 115 places the circuit modules in a lower voltage mode of operation. In one embodiment, the lower voltage mode is a low power mode where the circuit maintains state and does not change stage or changes state at a lower frequency to save power. However, other implementations of a low voltage mode may be utilized in other embodiments.

Circuit 100 includes a biasing stage 108 that includes a load transistor 117 and a bias transistor 119 for setting the voltage that the regulated nodes 113 and 115 are raised above system ground when the ENABLE signal is asserted. In the embodiment shown, load transistor is a P channel MOSFET with its body and source tied to a system VDD terminal. The drain and gate of transistor 117 are connected to the drain of bias transistor 119 at regulated node 125. Bias transistor 119 has a gate connected to regulated node 113 for controlling the conductivity of transistor 119. In the embodiment shown, transistor 119 is N channel MOSFETs. The body and source of transistor 119 are tied to a system ground terminal.

In operation, the leakage current ($I_{LC0}$) of circuit module 101 acts as a load current for transistor 107 and charges up node 113 when the ENABLE signal is asserted low. The leakage current ($I_{LC1}$) from module 103 acts as a load current for transistor 111 and charges up node 115 when the ENABLE signal is asserted low.

Circuit 100 includes a control loop for controlling the voltages of regulated nodes 113 and 115 (and regulated node 125 as well). The control loop includes bias transistors 107, 111, and 119, nodes 113, 115, and 125, and the circuit paths that connect them. In operation, when the ENABLE signal is asserted low, the voltage at node 125 controls the conductivity of transistor 111 which controls the voltage of regulated node 115. The voltage of regulated node 115 controls the conductivity of transistor 107 which controls the voltage of regulated node 113. The voltage of node 113 controls the conductivity of transistor 119 which sets the voltage of node 125.

The control loop is configured to provide negative feedback for controlling the voltage of the regulated nodes 113 and 115. For example, when the voltage of node 113 rises due to an increase in the leakage current $I_{LC0}$, the voltage at the gate of transistor 119 rises to increase the conductivity of those transistors to pull the voltage of node 125 down. The voltage of node 125 decreasing lowers the conductivity of transistor 111 to increase the voltage of node 115. Increasing the voltage of node 115 causing an increase in conductivity of transistor 107 to counter the rising voltage of node 113 due to the increase in leakage current from module 101.

In addition to the voltage of node 125 being controlled by the conductivity of transistor 119, the steady state voltage at node 125 is a function of the characteristics of load transistor 117 and bias transistors 119. For example, the voltage of node 125 is dependent upon the ratio of the effective width of transistor 117 versus the effective width of transistor 119.

In other embodiments, bias stage 108 may have other configurations. For example, in other embodiments, circuit 100 may include additional circuit module stages that include bias transistors and regulated voltages implemented in the control loop. Also in other embodiments, each stage would include an additional bias transistor in parallel with the bias transistor (107, 111, and 119) to increase the effective width of the bias transistor, to thereby lower the regulated voltage. In one such embodiment, the additional bias transistors would be selectively enabled to adjust the regulated voltage during operation. In one example, an enabling transistor would be located in series with the additional bias transistor to selectively couple the additional bias transistor to ground for enablement based upon e.g. a mode select signal.

Utilizing a circuit with multiple stages including different circuit modules enables a circuit to provide regulated voltages with less "overhead" circuitry and consume less overhead power. For example, with such a system, two circuit modules can "share" a biasing stage (108) as opposed to systems where each module includes its own biasing stage or multiple biasing stages. In the embodiment of FIG. 1, the use of two circuit module stages may in some embodiments, reduce the need for additional stages in providing negative feedback.

Furthermore, implementing a system with multiple stages and a control loop to provide negative feedback allows for the system to use leakage current as a load source current thereby saving circuitry as well as reducing "overhead" load source current. Implementing negative feedback allows for the circuit to control the regulated voltages when the leakage current varies disproportionately or unexpectantly.

Figure 2:
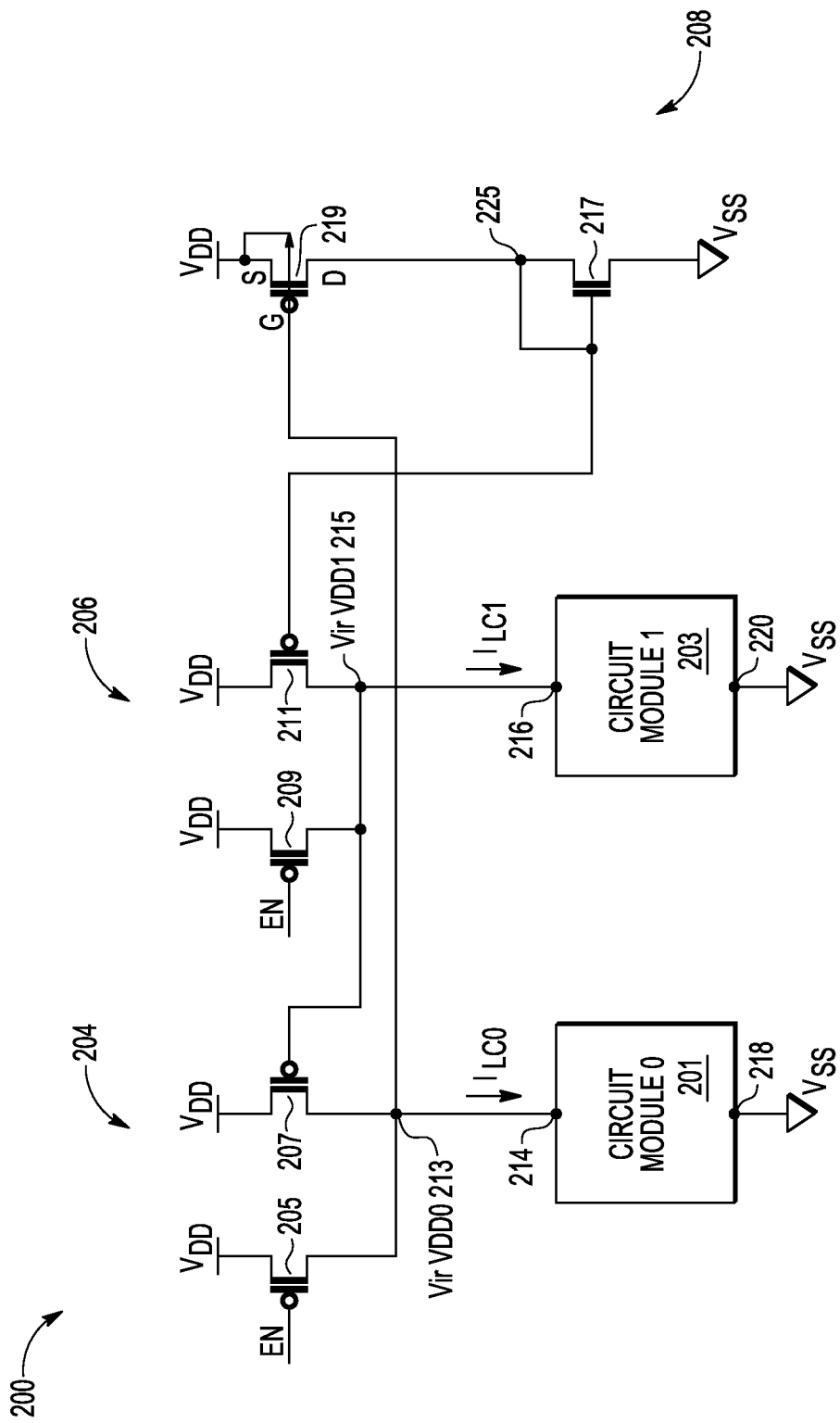
FIG. 2 is a circuit diagram of an electronic circuit with a multistage voltage regulator according to one embodiment of the present invention.

FIG. 2 is a circuit diagram of another embodiment of a circuit including a multistage voltage regulator according to the present invention. The embodiment of FIG. 2 is similar to the embodiment of FIG. 1 except that the regulated voltages (VirVDD0 and VirVDD1) of the regulated voltage nodes 213 and 215 are provided to the high voltage supply terminals (214 and 216) of the circuit modules (201 and 203). The low voltage supply terminals (214 and 216) of each module are connected to a system ground terminal.

Circuit 200 includes two circuit module stages (204 and 206) and a biasing stage 208. Each circuit module stage includes a circuit module (201 and 203), an activation transistor (205 and 209), and a bias transistor (207 and 211). The biasing stage 208 includes a load transistor 217 and a bias transistor 219. The gate of bias transistor 219 is connected to regulated node 213. The body and source of bias transistor 219 are connected to a high power supply terminal VDD, and the drain of transistor 219 is connected to node 225.

In the embodiment shown, when the ENABLE signal is at a non asserted low voltage state, the voltage of the regulated nodes 213 and 215 are pulled to VDD to provide voltage VDD to the high voltage terminals 214 and 216. When the ENABLE signal is at an asserted high voltage, nodes 213 and 215 supply terminals 214 and 216 with a regulated voltage that is lower than VDD.

In one embodiment, the ENABLE signal is used to lower the high supply voltage to circuit modules 201 and 203 from VDD to a voltage less than VDD during a low voltage mode. The value of the regulated voltage is dependent upon the ratio of the effective width of transistor 219 versus the width of transistor 217. In one embodiment where VDD is 1 Volt, the regulated voltage is 0.7 Volts. However, the regulated voltage may be other voltage values less than VDD in other embodiments.

The stages 204, 206 and 208 are configured to control the regulated voltages of nodes 213 and 215 (when the ENABLE signal is asserted) with a control loop using negative feedback. During operation when the ENABLE signal is asserted, the voltage of node 213 is controlled by the conductivity of transistor 207 and the leakage current ($I_{LC0}$) from circuit module 201. The conductivity of transistor 207 is controlled by the voltage of node 215. The voltage of node 215 is controlled by the conductivity of transistor 211. The conductivity of transistor 211 is controlled by the voltage of node 225. The voltage of node 225 is controlled by the conductivity of transistor 219, which is controlled by the voltage of node 213. If a regulated node 213 or 215 drops below the regulated voltage due to increased leakage current, the negative feedback of the control loop will counter act the increase in leakage current to pull the voltage of the node back up to the regulated voltage level.

For example, when the ENABLE signal is asserted, if leakage current $I_{LC0}$ increases, the voltage of node 213 will decrease in response thereto. A decrease in the voltage of node 213 causes transistor 219 to become more conductive thereby raising the voltage of node 225, which causes transistor 211 to become less conductive. Decreasing the conductivity of transistor 211 lowers the voltage of node 215, which causes transistor 207 to become more conductive to increase the voltage of node 213 to counteract the decrease in voltage from the increase in leakage current. Accordingly, the negative feedback provided the by the control loop acts to stabilize the regulated voltages caused by an increase or decrease in the leakage currents.

FIG. 2 may have other configurations in other embodiments including other features or circuitry described with respect to the other embodiments disclosed herein.

Figure 3:
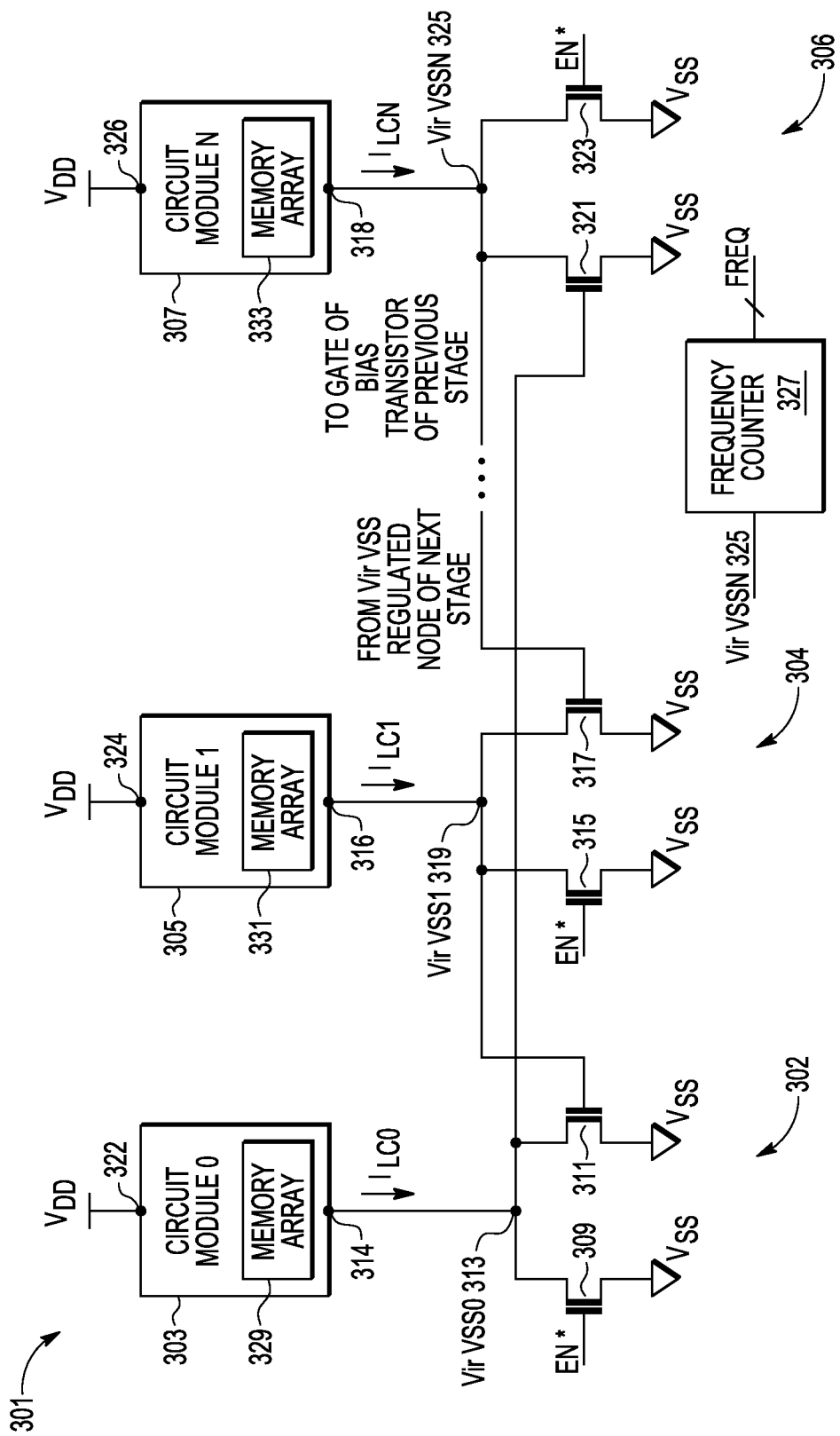
FIG. 3 is a circuit diagram of an electronic circuit with a multistage voltage regulator according to one embodiment of the present invention.

FIG. 3 is a circuit diagram of another embodiment of a circuit including a multistage voltage regulator according to the present invention. The embodiment of FIG. 3 includes a plurality of stages (N+1) where N is an even integer number, with three stages shown in FIG. 3. Each stage (302, 304, and 306) includes a circuit module (303, 305, and 307), an activation transistor (309, 315, and 323), and a bias transistor (311, 317, and 321). Each stage also includes a regulated node (313, 319, and 325) for providing a supply voltage to a low voltage supply terminal (314, 319, and 318) of a circuit module. The gates of the activation transistors are connected to receive an ENABLE signal (EN*) that when in a non asserted state pulls the voltage of the regulated nodes 313, 319, and 325 to VSS. The high voltage supply terminals (322, 324, and 326) of each circuit module are connected to a system VDD supply voltage terminal.

The stages are coupled in series in a loop where the gates of the bias transistors 311, 317 and 321 are each connected to a regulated node of a subsequent stage (302, 304, or 306) in one direction of the loop. For example, the gate of transistor 311 is connected to regulated node 319. The gate of transistor 321 of the Nth stage 306 is connected to the regulated node 313 of stage 302. In embodiments that include only the three stages, the gate of transistor 317 is connected to node 325. If circuit 301 included additional stages, those stages would be located between stages 304 and 306. In an embodiment that includes more stages, the gate of transistor 317 would be connected to a regulated node of the next stage (not shown) in series in one direction and regulated node 325 would be connected to a previous stage (not shown) in the loop in the opposite direction. Accordingly, the circuit of FIG. 3 implements a control loop that includes the bias transistors and regulated nodes for controlling the voltages of the regulated nodes using negative feedback.

In operation when the ENABLE signal is asserted low, the voltage of node 313 is controlled by the leakage current of module 303 ($I_{LC0}$) and the conductivity of transistor 311. The voltage of node 313 controls the conductivity of transistor 321. The conductivity of transistor 321 controls the voltage of node 325. In a three stage embodiment where node 325 is connected to the gate of transistor 317, the voltage of node 325 controls the conductivity of transistor 317. The conductivity of transistor 317 controls the voltage of node 319 which controls the conductivity of transistor 311 to control the voltage of node 313. Circuit 301 includes a control loop that implements negative feedback from other stages to control the voltage of a regulated node. If the voltage of node 313 is pulled higher by higher leakage current $I_{LC0}$, the conductivity of transistor 321 will increase to lower the voltage of node 325, which (in a three stage embodiment) lowers the voltage of the gate of transistor 317 causing the voltage of node 319 to increase, which increases the conductivity of transistor 311 to lower the voltage of node 313, thereby counteracting the increase in voltage due the higher leakage current ($I_{LC0}$).

In one embodiment, the control loop of circuit 301 is designed to be "stable" (have a high degree of stability). In such examples, the voltages at the regulated nodes 313, 319, and 325 (in a three stage embodiment) reach and remain at a steady state value maintained by the control loop when the ENABLE signal is asserted low. The specific steady state value is dependent on the characteristics of the bias transistors (311, 317, and 323) as well as the characteristics of the circuit modules (such as size and transistor configuration). For example, the greater the effective width of the bias transistors, the lower the steady state regulated voltage.

However, in other embodiments, the control loop of circuit 301 may be designed to be "unstable" (or have a low degree of stability) when the ENABLE signal is asserted low. With such a circuit, the voltages at the regulated nodes would oscillate (at a detectable level) around a steady state voltage at a frequency depending upon the leakage current of all of the modules. The greater the leakage current, the higher the frequency of the oscillation. The amplitude of the oscillation would be dependent upon the degree of stability designed in the control loop. The less stability, the higher the amplitude of the oscillation.

The designed stability of a control loop may be defined by a number of factors such as the loop gain and phase margin of the control loop. Loop gain is set by the gain of each stage (302, 304, and 306). The gain of a stage may be determined by the bias transistor size, circuit module size and/or configuration (and leakage current there from), and added capacitance to a selected regulated node. In one example, a more stable control loop may be achieved by separating the pole frequency of one of the regulated nodes of a stage (e.g. with added capacitance) from the pole frequencies of the other regulated nodes by e.g. a factor of 10×.

In one embodiment for achieving control loop stability, the total loop gain of the control loop is greater than unity and the phase margin of the loop is not an integer multiple of 360. In one example of a "stable" system, the dominate pole of stage 104 is made dominate by adding capacitance to node 113 or increasing the size, and therefore the parasitic capacitance, of the circuit module of the stage. In an example of a relatively unstable system, the loop gain is greater than unity and the phase margin is an integer multiple of 360.

For circuits that have a lower degree of control loop stability, the frequency of oscillation can be measured to provide an indication of leakage current of the circuit modules. For example, circuit 301 includes a frequency counter circuit 327 that has an input connected to one of the regulated nodes (e.g. 325) and an output to provide an indication of the frequency of the oscillation which can be used as indication of total leakage current of the circuit modules.

Referring back to FIGS. 1 and 2, in one embodiment, those circuits may be designed to have a high degree of control loop stability in order to keep the steady state regulated voltage within a tightly defined range. However, in other embodiments, the control loops may be designed with more loop instability such that the regulated voltages oscillate to a degree that the frequency can be measured using a frequency counter (e.g. 327 in FIG. 3) and leakage current can be determined from the measured frequency. In one embodiment, the circuit modules have high transistor count or total transistor width is high such that systemic variation component of the leakage dominates the random variation component of the leakage current. The frequency measure can be used as an indicator for systemic variation of the leakage current.

In other embodiments of FIG. 3, each stage may include an additional bias transistor coupled in parallel with the bias transistor (311, 317, and 321) that can be selectively enabled with a second additional transistor in series with the additional bias transistor to selectively control the voltage of the regulated nodes 313, 319, and 325 by increasing the effective width of the bias transistor. Also, other embodiments of FIG. 3 may not include activation transistors 309, 315, and 321.

Figure 4:
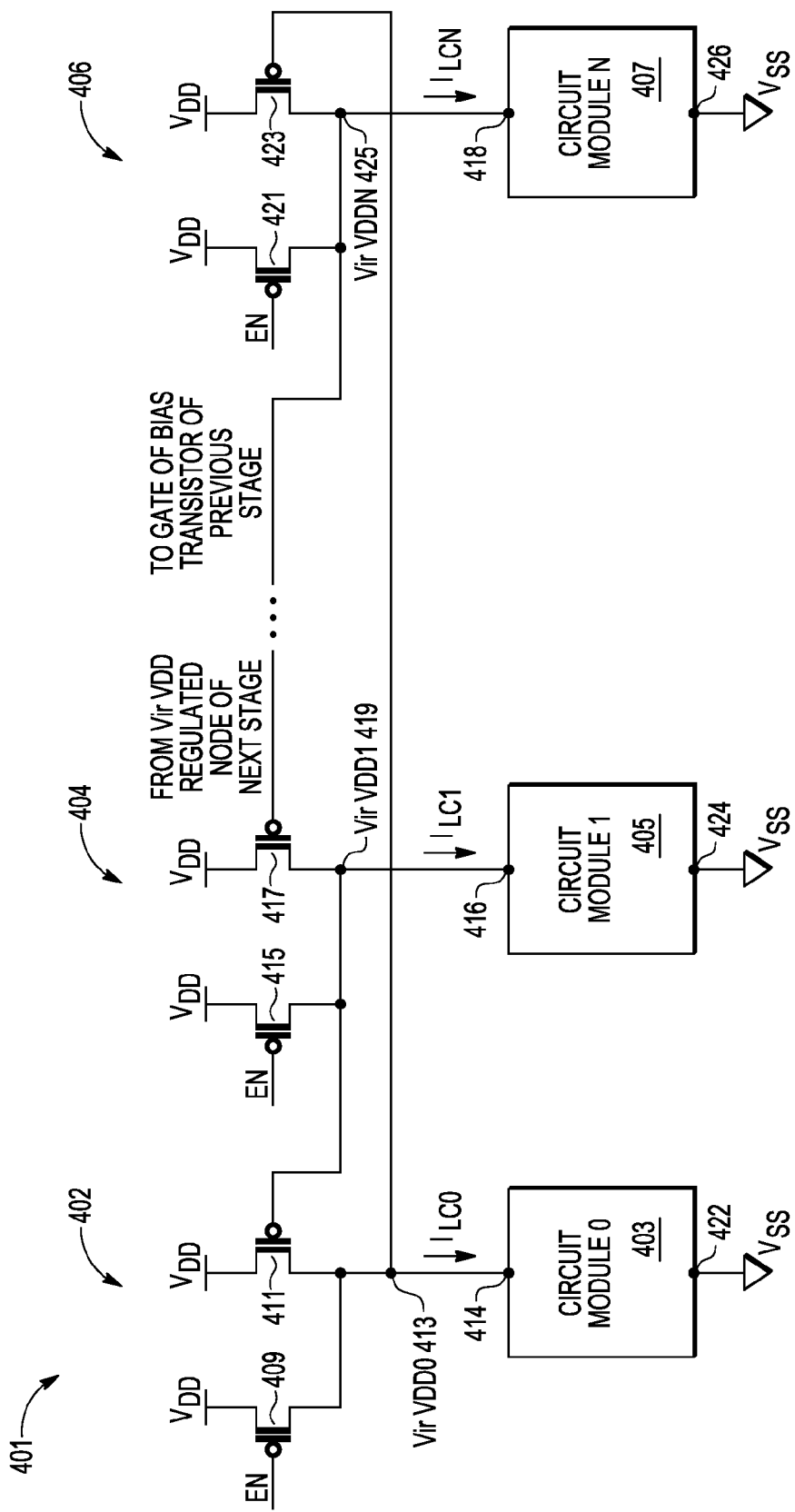
FIG. 4 is a circuit diagram of an electronic circuit with a multistage voltage regulator according to one embodiment of the present invention.

FIG. 4 is a circuit diagram of another embodiment of a circuit including a multistage voltage regulator according to the present invention. The embodiment of FIG. 4 is similar to the embodiment of FIG. 3 except that the regulated nodes 413, 419, and 425 are connected to the high voltage supply terminals (414, 416, and 418) of the circuit modules (403, 405, and 407). The low voltage supply terminals (422, 424, and 426) are connected to a system ground terminal.

The embodiment of FIG. 4 includes a plurality of stages (N+1) where N is an even integer number, with three stages shown in FIG. 4. Each stage (402, 404, and 406) includes a circuit module (403, 405, and 407), an activation transistor (409, 415, and 421), and a bias transistor (411, 417, and 423). Each stage also includes a regulated node (413, 419, and 425) for providing a supply voltage to a high voltage supply terminal (414, 416, and 418) of the circuit modules. The gates of the activation transistors are connected to receive an ENABLE signal (EN) that when in a non asserted low voltage state, pulls the voltage of the regulated nodes 413, 419, and 425 to VSS.

The stages are coupled in series in a loop where the gates of the bias transistors (411, 417 and 423) are each connected to a regulated node of a subsequent stage (402, 404, or 406) in one direction of the loop. For example, the gate of transistor 411 is connected to regulated node 419. The gate of transistor 423 of the Nth stage 406 is connected to the regulated node 413 of stage 402. In embodiments that include only three stages, the gate of transistor 417 is connected to node 425. If circuit 401 included additional stages, those stages would be located between stages 404 and 406. In an embodiment that includes more stages, the gate of transistor 417 would be connected to a regulated node of the next stage (not shown) in the series in the loop in one direction and regulated node 425 would be connected to a previous stage (not shown) in the loop in the opposite direction. Accordingly, the circuit of FIG. 4 implements a control loop that includes the bias transistors and regulated nodes for controlling the voltages of the regulated nodes using negative feedback.

In operation when the ENABLE signal is asserted, the voltage of node 413 is controlled by the leakage current of module 403 ($I_{LC0}$) and the conductivity of transistor 411. The voltage of node 413 controls the conductivity of transistor 423. The conductivity of transistor 423 controls the voltage of node 425. In a three stage embodiment where node 425 is connected to the gate of transistor 417, the voltage of node 425 controls the conductivity of transistor 417. The conductivity of transistor 417 controls the voltage of node 419 which controls the conductivity of transistor 411 to control the voltage of node 413. Circuit 401 employs negative feedback from other stages to control the voltage of a regulated node. If the voltage of node 413 is pulled higher by a decrease in leakage current $I_{LC0}$, the conductivity of transistor 423 will decrease to lower the voltage of node 425, which (in a three stage embodiment) lowers the voltage on the gate of transistor 417 causing the voltage of node 419 to increase, which decreases the conductivity of transistor 411 to lower the voltage of node 413, thereby counteracting the increase in voltage due the decrease in leakage current.

Circuit 401 may have other configurations and/or include other circuitry (e.g. a frequency counter) in other embodiments. For example, similar modifications discussed with respect to the circuits with the previous figures may be made to circuit 401.

In some embodiments, both the high voltage supply terminals and the low voltage supply terminals of the circuit modules may be coupled to regulated nodes. In one example, a VirVSS regulated voltage is supplied to the low voltage supply terminal of a circuit module and a VirVDD regulated voltage is supplied to the high voltage supply terminal of the circuit module to reduce the operating voltage provided to the circuit module during a low voltage mode.

A gate is a control terminal for a MOSFET. A source is a current terminal for a MOSFET, and a drain is a current terminal for a MOSFET. As used herein, the term "connected" means directly coupled.

In one embodiment, a circuit comprises a first stage. The first stage comprises a first circuit module. The first circuit module includes a voltage supply terminal and a first regulated node. The first regulated node is connected to the voltage supply terminal of the first circuit module. The first stage includes a first bias transistor including a first current terminal coupled to a power supply terminal and a second current terminal coupled to the first regulated node. The circuit comprises a second stage. The second stage comprises a second circuit module. The second circuit module includes a voltage supply terminal and a second regulated node. The second regulated node is connected to the voltage supply terminal of the second circuit module. The second stage comprises a second bias transistor including a first current terminal coupled to the power supply terminal and a second current terminal coupled to the second regulated node. The circuit comprises a control loop for controlling a voltage of the first regulated node and a voltage of the second regulated node. The control loop includes the first bias transistor, the second bias transistor, the first regulated node, and the second regulated node. The control loop includes a coupling of a control terminal of the first bias transistor to the second regulated node.

In another embodiment, a circuit comprises a first stage. The first stage comprises a first circuit module. The first circuit module includes a voltage supply terminal and a first regulated node. The first regulated node is connected to the voltage supply terminal. The first stage comprises a first bias transistor including a first current terminal coupled to a power supply terminal and a second current terminal connected to the first regulated node. The circuit comprises a second stage. The second stage comprises a second circuit module. The second circuit module includes a voltage supply terminal and a second regulated node. The second regulated node is connected to the voltage supply terminal of the second circuit module. The second circuit module includes a second bias transistor including a first current terminal coupled to the power supply terminal and a second current terminal connected to the second regulated node. The circuit includes a third stage. The third stage comprises a third regulated node and a third bias transistor including a first current terminal coupled to the power supply terminal and a second current terminal connected to the third regulated node. The second regulated node is connected to a control terminal of the first bias transistor. The first regulated node is connected to a control terminal of the third bias transistor.

In another embodiment, a circuit comprises a plurality of stages connected in a series in a loop. Each stage of the plurality of stages comprises a circuit module, a regulated node connected to a voltage supply terminal of the circuit module of the each stage, and a bias transistor including a first current terminal connected to the regulated node of the each stage and a second current terminal coupled to a power supply terminal. For each stage of the plurality of stages, the regulated node of the each stage of the plurality of stages is connected to a control terminal of a bias transistor of a stage of a plurality of stages adjacent in the series in the loop in a first direction to the each stage, and a control terminal of the bias transistor of the each stage is connected to a regulated node of a stage of the plurality of stages adjacent in the series in the loop in a second direction to the each stage.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A multistage voltage regulator circuit comprising:
a first stage, the first stage comprising:
   a first circuit module including a first plurality of memory cells of a first memory array, the first circuit module including a first voltage supply terminal;
   a first regulated node, the first regulated node is connected to the first voltage supply terminal of the first circuit module to supply a first supply voltage to the first voltage supply terminal, wherein current flowing through the first voltage supply terminal supplies power to the first plurality of memory cells; and
   a first bias transistor including a first current terminal coupled to a first power supply terminal and a second current terminal coupled to the first regulated node;
a second stage, the second stage comprising:
   a second circuit module including a second plurality of memory cells of a second memory array, the second circuit module including a second voltage supply terminal;
   a second regulated node, the second regulated node is connected to the second voltage supply terminal of the second circuit module to supply a second supply voltage to the second voltage supply terminal, wherein current flowing through the second voltage supply terminal of the second circuit module supplies power to the second plurality of memory cells; and
a second bias transistor including a first current terminal coupled to the first power supply terminal and a second current terminal coupled to the second regulated node;
a bias stage, the bias stage comprising:
a third node, and
a third bias transistor including a first current terminal coupled to the first power supply terminal and a second current terminal coupled to the third node; and
a control loop for regulating the first supply voltage of the first regulated node and the second supply voltage of the second regulated node, wherein the control loop includes the first bias transistor, the second bias transistor, the third bias transistor, the first regulated node, the second regulated node, and the third node, wherein the control loop includes a coupling of a control terminal of the first bias transistor to the second regulated node, and wherein the control loop further includes a coupling of the first regulated node to a control terminal of the third bias transistor.

2. The multistage voltage regulator circuit of claim 1 wherein
the bias stage including a load transistor, wherein a first current terminal of the load transistor is coupled to the third node.

3. The multistage voltage regulator circuit of claim 1 wherein the control loop includes a coupling of the third node to a control terminal of the second bias transistor.

4. The multistage voltage regulator circuit of claim 1 wherein:
the first voltage supply terminal of the first circuit module and the second voltage supply terminal of the second circuit module are characterized as low voltage supply terminals; and
the first power supply terminal is characterized as a low voltage power supply terminal.

5. The multistage voltage regulator circuit of claim 1 wherein:
the first voltage supply terminal of the first circuit module and the second voltage supply terminal of the second circuit module are characterized as high voltage supply terminals; and
the first power supply terminal is characterized as a high voltage power supply terminal.

6. The multistage voltage regulator circuit of claim 1 wherein;
the first stage includes a first activation transistor including a first current terminal coupled to the first power supply terminal and a second current terminal coupled to the first regulated node, and a control terminal coupled to receive a first signal;
the second stage includes a second activation transistor including a first current terminal coupled to the first power supply terminal, a second current terminal coupled to the second regulated node, and a control terminal coupled to receive the first signal;
wherein when the first signal is in a first state, the first activation transistor is conductive to bias the first regulated node at a voltage of the first power supply terminal and the second activation transistor is conductive to bias the second regulated node at the voltage of the first power supply terminal; and
wherein when the first signal is in a second state, the first activation transistor and the second activation transistor are non conductive wherein the control loop controls the first supply voltage of the first regulated node and the second supply voltage of the second regulated node.

7. The multistage voltage regulator circuit of claim 1 further comprising:
a frequency counter including an input coupled to one of the first regulated node or the second regulated node and an output to provide an indication of a frequency of oscillation of a voltage of the first regulated node or the second regulated node that is connected to the input.

8. The circuit of claim 1 wherein the control loop is designed to be stable during operation.

9. The multistage voltage regulator circuit of claim 2 wherein:
the first circuit module includes a third voltage supply terminal, the third voltage supply terminal of the first circuit module is coupled to a second power supply terminal;
the second circuit module includes a fourth voltage supply terminal, the fourth voltage supply terminal of the second circuit module is coupled to the second power supply terminal; and
a second current terminal of the load transistor is coupled to the second power supply terminal.

10. The multistage voltage regulator circuit of claim 9 wherein
the third voltage supply terminal of the first circuit module and the fourth voltage supply terminal of the second circuit module are characterized as high voltage supply terminals; and
the second power supply terminal is characterized as a high voltage power supply terminal.

11. The multistage voltage regulator circuit of claim 9 wherein
the third voltage supply terminal of the first circuit module and the fourth voltage supply terminal of the second circuit module are characterized as low voltage supply terminals; and
the second power supply terminal is characterized as a low voltage power supply terminal.

12. A circuit comprising:
a first stage, the first stage comprising:
a first circuit module including a first plurality of memory cells, the first circuit module including a first voltage supply terminal;
a first regulated node, the first regulated node is connected to the first voltage supply terminal to supply a first supply voltage to the first voltage supply terminal, wherein current flowing through the first voltage supply terminal supplies power to the first plurality of memory cells; and
a first bias transistor including a first current terminal coupled to a first power supply terminal and a second current terminal connected to the first regulated node;
a second stage, the second stage comprising:
a second circuit module including a second plurality of memory cells, the second circuit module including a second voltage supply terminal;
a second regulated node, the second regulated node is connected to the second voltage supply terminal of the second circuit module to supply a second supply voltage to the second voltage supply terminal, wherein current flowing through the second voltage supply terminal of the second circuit module supplies power to the second plurality of memory cells; and a second bias transistor including a first current terminal coupled to the first power supply terminal and a second current terminal connected to the second regulated node; and a third stage, the third stage comprising:
   a third regulated node; and
   a third bias transistor including a first current terminal coupled to the first power supply terminal and a second current terminal connected to the third regulated node;
wherein the second regulated node is connected to a control terminal of the first bias transistor; and
wherein the first regulated node is connected to a control terminal of the third bias transistor.

13. The circuit of claim 12 wherein the third stage includes a third circuit module including a third voltage supply terminal connected to the third regulated node.

14. The circuit of claim 12 further comprising:
a frequency counter including an input coupled to one of the first regulated node, the second regulated node, or the third regulated node, and an output to provide an indication of a frequency of oscillation of a voltage of the first regulated node, the second regulated node, or the third regulated node that is coupled to the input of the frequency counter.

15. The circuit of claim 12 wherein the third stage includes a load transistor including a first current terminal connected to the third regulated node and a control terminal connected to the third regulated node.

16. The circuit of claim 12 wherein:
the first stage includes a first activation transistor including a first current terminal coupled to the first power supply terminal and a second current terminal connected to the first regulated node, and a control terminal coupled to receive a first signal;
the second stage includes a second activation transistor including a first current terminal coupled to the first power supply terminal, a second current terminal connected to the second regulated node, and a control terminal coupled to receive the first signal;
wherein when the first signal is in a first state, the first activation transistor is conductive to bias the first regulated node at a voltage of the first power supply terminal and the second activation transistor is conductive to bias the second regulated node at the voltage of the first power supply terminal;
wherein when the first signal is in a second state, the first activation transistor and the second activation transistor are non conductive, wherein the first supply voltage of the first regulated node is regulated by the second supply voltage of the second regulated node and a voltage of the third regulated node is regulated by the first supply voltage of the first regulated node.

17. The circuit of claim 12 where the first circuit module and the second circuit module each include a memory array.

18. The circuit of claim 12 wherein the third stage includes a third activation transistor including a first current terminal coupled to the first power supply terminal, a second current terminal connected to the third regulated node, and a control terminal coupled to receive the first signal.

19. A circuit comprising:
a plurality of N+1 stages connected in a series in a loop, wherein N is an even integer of two or greater, wherein each stage of the plurality of stages comprises:
   a circuit module including a plurality of memory cells;
   a regulated node connected to a voltage supply terminal of the circuit module of the each stage to supply a supply voltage to the voltage supply terminal, wherein current flowing through the voltage supply terminal supplies power to the plurality of memory cells of each stage;
   a bias transistor including a first current terminal connected to the regulated node of the each stage and a second current terminal coupled to a power supply terminal;
wherein for each stage of the plurality of stages, the regulated node of the each stage of the plurality of stages is connected to a control terminal of a bias transistor of a previous stage of the plurality of N+1 stages, wherein the previous stage is adjacent to the each stage in the series in a first direction of the loop, and a control terminal of the bias transistor of the each stage is connected to a regulated node of a subsequent stage of the plurality of N+1 stages, wherein the subsequent stage is adjacent to the each stage in the series in a second direction of the loop, wherein the second direction is opposite the first direction.

20. The circuit of claim 19 further comprising:
a frequency counter including an input coupled to a regulated node of a stage of the plurality of stages and an output to provide an indication of a frequency of oscillation of a voltage of the regulated node that the input is coupled to.

21. The circuit of claim 19 wherein the circuit module of each stage of the plurality of stages includes a memory array.

* * * * *